United States Patent
Hu

(10) Patent No.: US 9,312,263 B2
(45) Date of Patent: Apr. 12, 2016

(54) STATIC RANDOM ACCESS MEMORY CELL AND FORMING METHOD THEREOF

(71) Applicant: Shanghai Huahong Grace Semiconductor Manufacturing Corporation, Shanghai (CN)

(72) Inventor: Jian Hu, Shanghai (CN)

(73) Assignee: Shanghai Huadong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/580,967

(22) Filed: Dec. 23, 2014

(65) Prior Publication Data

US 2015/0194431 A1  Jul. 9, 2015

(30) Foreign Application Priority Data

Jan. 7, 2014 (CN) .......................... 2014 1 0005710

(51) Int. Cl.
*H01L 27/11* (2006.01)
*H01L 21/8244* (2006.01)
*H01L 21/02* (2006.01)
(Continued)

(52) U.S. Cl.
CPC .......... *H01L 27/1104* (2013.01); *G11C 11/412* (2013.01); *H01L 21/0214* (2013.01); *H01L 21/0217* (2013.01); *H01L 21/02164* (2013.01);
(Continued)

(58) Field of Classification Search
CPC ............ H01L 27/1104; H01L 21/0214; H01L 21/02164; H01L 21/0217; H01L 29/7843; H01L 2924/1437

USPC .............................. 257/368, 393; 365/189.11
See application file for complete search history.

(56) References Cited

U.S. PATENT DOCUMENTS

| | | | | |
|---|---|---|---|---|
| 6,573,172 B1 * | 6/2003 | En | ...................... | H01L 21/76832 257/E21.576 |
| 6,984,564 B1 * | 1/2006 | Huang | .................... | H01L 27/11 257/E21.661 |

(Continued)

FOREIGN PATENT DOCUMENTS

| | | |
|---|---|---|
| CN | 101213668 A | 7/2008 |
| CN | 101558494 A | 10/2009 |

(Continued)

OTHER PUBLICATIONS

First Chinese Office Action regarding Application No. 201410005710.3 dated Dec. 21, 2015. English translation provided by Unitalen Attorneys at Law.

*Primary Examiner* — Earl Taylor
(74) *Attorney, Agent, or Firm* — Harness, Dickey & Pierce, P.L.C.

(57) ABSTRACT

A SRAM cell and a forming method thereof are provided. The SRAM cell includes: a pull-up transistor, a pull-down transistor, a pass gate transistor, a tensile stress film which covers the pull-up transistor and the pull-down transistor, and an interlayer dielectric isolating layer which covers the tensile stress film and the pass gate transistor. The method includes: providing a semiconductor substrate; forming a pull-up transistor, a pull-down transistor and a pass gate transistor on the semiconductor substrate; forming a tensile stress film covering the pull-up and pull-down transistors; and forming an interlayer dielectric isolating layer covering the tensile stress film and the pass gate transistor. Write margin of the SRAM cell may be increased and an area of the SRAM cell may be reduced.

10 Claims, 4 Drawing Sheets

(51) Int. Cl.
  *H01L 29/78* (2006.01)
  *G11C 11/412* (2006.01)
  *H01L 27/02* (2006.01)

(52) U.S. Cl.
  CPC ...... *H01L 21/02263* (2013.01); *H01L 27/0207* (2013.01); *H01L 29/7843* (2013.01)

(56) References Cited

U.S. PATENT DOCUMENTS

| | | | |
|---|---|---|---|
| 7,060,549 B1 | 6/2006 | Craig et al. | |
| 7,232,730 B2 * | 6/2007 | Chen | H01L 29/7843 257/E21.435 |
| 7,238,990 B2 | 7/2007 | Burnett et al. | |
| 7,388,267 B1 * | 6/2008 | Chen | H01L 27/11 257/190 |
| 7,471,548 B2 * | 12/2008 | Baiocco | H01L 27/11 257/418 |
| 7,718,485 B2 | 5/2010 | Burnett et al. | |
| 7,727,834 B2 * | 6/2010 | Sudo | H01L 21/76802 438/199 |
| 7,799,644 B2 * | 9/2010 | White | H01L 21/823814 257/E21.634 |
| 7,977,183 B2 | 7/2011 | Koide | |
| 8,779,522 B2 | 7/2014 | Koide | |
| 8,975,703 B2 * | 3/2015 | Gan | H01L 27/092 257/368 |
| 9,178,062 B2 * | 11/2015 | Gan | H01L 29/7848 |
| 2003/0040158 A1 * | 2/2003 | Saitoh | H01L 21/823807 438/279 |
| 2005/0285202 A1 * | 12/2005 | Huang | H01L 27/11 257/368 |
| 2006/0226490 A1 | 10/2006 | Burnett et al. | |
| 2007/0187770 A1 * | 8/2007 | Ahn | H01L 21/823807 257/369 |
| 2007/0218618 A1 | 9/2007 | Burnett et al. | |
| 2008/0142895 A1 * | 6/2008 | Baiocco | H01L 27/1104 257/369 |
| 2009/0166757 A1 * | 7/2009 | Baiocco | H01L 27/1104 257/393 |
| 2009/0189227 A1 * | 7/2009 | Miyashita | H01L 27/1107 257/393 |
| 2010/0117158 A1 | 5/2010 | Koide | |
| 2010/0190354 A1 | 7/2010 | Burnett et al. | |
| 2011/0260256 A1 | 10/2011 | Koide | |
| 2012/0280324 A1 * | 11/2012 | Xiong | H01L 27/1104 257/368 |
| 2015/0194431 A1 * | 7/2015 | Hu | G11C 11/412 257/390 |

FOREIGN PATENT DOCUMENTS

| | | |
|---|---|---|
| CN | 101740516 A | 6/2010 |
| CN | 102683188 A | 9/2012 |

* cited by examiner

STATIC RANDOM ACCESS MEMORY CELL AND FORMING METHOD THEREOF

CROSS-REFERENCE TO RELATED APPLICATIONS

The present application claims priority to Chinese patent application No. 201410005710.3, filed on Jan. 7, 2014, and entitled "STATIC RANDOM ACCESS MEMORY CELL AND FORMING METHOD THEREOF", and the entire disclosures of which is incorporated herein by reference.

TECHNICAL FIELD

The present disclosure generally relates to memory technology field, and more particularly, to a static random access memory cell and a forming method thereof.

BACKGROUND

Static Random Access Memory (SRAM) is a type of random access memory. The term 'static' differentiates it from Dynamic Random Access Memory (DRAM) which must be periodically refreshed. Data can be well maintained in a SRAM as long as the SRAM keeps powered. However, when the SRAM is cut off from power, the data stored therein will be lost. In comparison, a Read Only Memory (ROM) or a flash memory can still keep the data stored therein even when power is off.

FIG. 1 illustrates a circuit diagram of a 6T SRAM cell. Referring to FIG. 1, the 6T SRAM includes pull-up transistors PU1 and PU2, pull-down transistors PD1 and PD2, and pass gate transistors PG1 and PG2. The pull-up transistors PU1 and PU2 are P-Mental-Oxide-Semiconductor (PMOS) transistors, and the pull-down transistors PD1 and PD2 and the pass gate transistors PG1 and PG2 are N-Mental-Oxide-Semiconductor (NMOS) transistors. In FIG. 1, a word line WL, two source lines Vdd and Vss, and two bit lines BL and BLB are connected to the 6T SRAM cell. Data can be written to a node N1 and a node N2 by applying voltages to the word line WL and the bit lines BL and BLB.

Generally, write margin is used to indicate performance of a SRAM cell. Referring to FIG. 1, assume that in an original state, the node N1 is set at a high electrical level and stores data "1", and the node N2 is set at a low electrical level and stores data "0". Operations to write "0" into the node N1 and write "1" into the node N2 are illustrated as follows.

Before writing operation is initiated, the bit line BL is charged to a high electrical level and the bit line BLB is charged to a low electrical level. When the writing operation starts, a high voltage is applied to the word line WL to enable the pass gate transistors PG1 and PG2 in a conducting state. Since in the original state, the node N2 is set at the low electrical level to enable the pull-up transistor PU2 in a conducting state and enable the pull-down transistor PD2 in an off state, the pull-up transistor PU2 and the pass gate transistor PG2 are in a non-saturated conducting state at the beginning of the writing operation. Therefore, the node N1 changes from the high electrical level to a middle electrical level between the high electrical level and the low electrical level. The middle electrical level may depend on equivalent resistance of the pull-up transistor PU2 and the pass gate transistor PG2.

To write data, the value of the middle electrical level should be less than a predetermined value, i.e., a ratio of the equivalent resistance of the pass gate transistor PG2 to the equivalent resistance of the pull-up transistor PU2 should be less than the predetermined value. The smaller the value of the middle electrical level is, the greater the write margin of the SRAM shall be.

Nowadays, semiconductor devices are getting smaller while stress becomes more influential to device performance. Compressive stress can increase hole mobility of a PMOS transistor, and tensile stress can increase electron mobility of a NMOS transistor. In existing techniques, to improve performance of a SRAM cell, compressive stress films may be formed to cover the pull-up transistors in the SRAM cell, and tensile stress films may be formed to cover pull-down transistors and pass gate transistors in the SRAM cell.

However, although forming stress films covering transistors in a SRAM cell may improve its performance, it cannot increase write margin of the SRAM cell. Therefore, write margin of SRAM is relatively small in the existing techniques.

SUMMARY

In embodiments of the present disclosure, write margin of a SRAM cell may be increased.

In an embodiment, a SRAM cell is provided, including: a pull-up transistor, a pull-down transistor, a pass gate transistor, a tensile stress film which covers the pull-up transistor and the pull-down transistor, and an interlayer dielectric isolating layer which covers the tensile stress film and the pass gate transistor.

Optionally, the pull-up transistor may include a first gate region, a first source region, and a first drain region, and the tensile stress film covers the first gate region and at least a portion of the first source and drain regions. The pull-down transistor may include a second gate region, a second source region and a second drain region, and the tensile stress film covers the second gate region and at least a portion of the second source and drain regions.

Optionally, the tensile stress film may include one or more material selected from silicon oxide, silicon nitride and silicon oxynitride.

Optionally, a ratio of a thickness of the tensile stress film to a thickness of the second gate region may be within a range from ⅓ to ½.

Optionally, a ratio of the thickness of the tensile stress film to a thickness of the first gate region may be within the range from ⅓ to ½.

Optionally, the thickness of the tensile stress film may be within a range from 40 nm to 250 nm.

Optionally, the SRAM cell may include two pull-up transistors, two pull-down transistors and two pass gate transistors.

In an embodiment, a method for forming a SRAM cell is provided, including:
providing a semiconductor substrate;
forming a pull-up transistor, a pull-down transistor and a pass gate transistor on the semiconductor substrate;
forming a tensile stress film covering the pull-up and pull-down transistors; and
forming an interlayer dielectric isolating layer covering the tensile stress film and the pass gate transistor.

Optionally, forming the pull-up transistor, the pull-down transistor and the pass gate transistor on the semiconductor substrate may include: forming first source and drain regions, second source and drain regions, and third source and drain regions in the semiconductor substrate; and forming a first gate region, a second gate region and a third gate region on a surface of the semiconductor substrate, where the first source, drain and gate regions constitute the pull-up transistor, the second source, drain and gate regions constitute the pull-down transistor, and the third source, drain and gate regions constitute the pass gate transistor.

Optionally, forming the tensile stress film covering the pull-up and pull-down transistors may include: forming the tensile stress film on the first gate region, on at least a portion of the first source and drain regions, on the second gate region, and on at least a portion of the second source and drain regions.

Optionally, the tensile stress film may be formed by a vapor deposition process.

In the SRAM cell provided in embodiments of the present disclosure, the pull-up transistor and the pull-down transistor are covered with the tensile stress film while the pass gate transistor is not covered with any stress film. The pull-up transistor is a PMOS transistor. Due to the tensile stress generated by the tensile stress film, carrier mobility of the PMOS transistor decreases so that its equivalent resistance increases. As the pass gate transistor is not covered with any stress film, carrier mobility of the pass gate transistor does not change so that its equivalent resistance, compared to the existing techniques, remains unchanged. Therefore, write margin of the SRAM cell is increased.

Further, the pull-down transistor is a NMOS transistor. Due to the tensile stress generated by the tensile stress film, carrier mobility of the NMOS transistor increases, namely, carrier mobility of the pull-up transistor increases. As noise margin of a SRAM cell is positively correlated to the carrier mobility of the pull-up transistor, when the carrier mobility of the pass gate transistor does not change, the noise margin of the SRAM cell is increased. Besides, to a SRAM cell, static noise margin is also positively correlated to its unit ratio. The unit ratio denotes to a ratio of a width-to-length ratio of the pull-down transistor to a width-to-length ratio of the pass gate transistor. When the noise margin of the SRAM cell is increased due to the increased carrier mobility of the pull-up transistor, it is unnecessary to enlarge the pull-down transistor to further increase the noise margin, that is, a size of the pull-down transistor can be decreased and further an area of the SRAM cell may be reduced.

DETAILED DESCRIPTION

In the existing techniques as described in background, to improve performance of a SRAM cell, a pull-up transistor in the SRAM cell may be covered with a compressive stress film, and a pull-down transistor and a pass gate transistor in the SRAM cell may be covered with a tensile stress film.

Figure 1:
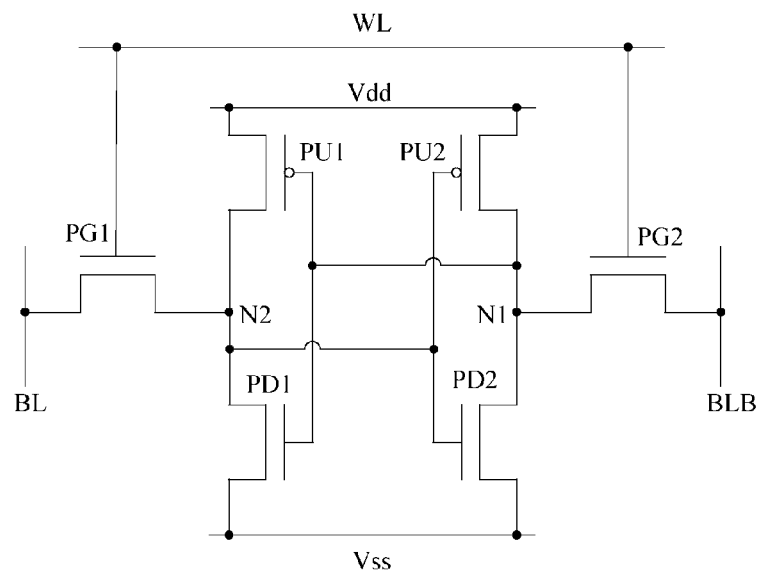
FIG. 1 illustrates a circuit diagram of a 6T SRAM cell in prior art.
Figure 2:
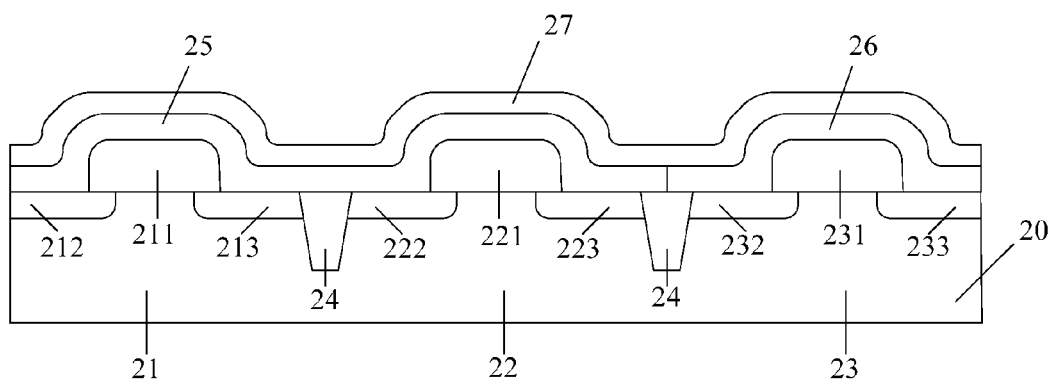
FIG. 2 illustrates a partial structural diagram of the 6T SRAM cell shown in FIG. 1.

FIG. 2 illustrates a partial structural diagram of the 6T SRAM cell shown in FIG. 1. Referring to FIG. 2, the 6T SRAM cell includes a pass gate transistor 21, a pull-down transistor 22, a pull-up transistor 23, a tensile stress film 25, a compressive stress film 26 and an interlayer dielectric isolation layer 27.

The pass gate transistor 21 is a NMOS transistor and may be the pass gate transistor PG1 or PG2 in FIG. 1. The pass gate transistor 21 includes a gate region 211 formed on a surface of a semiconductor substrate 20, and a source region 212 and a drain region 213 formed in the semiconductor substrate 20.

The pull-down transistor 22 is a NMOS transistor and may be the pull-down transistor PD1 or PD2 in FIG. 1. The pull-down transistor 22 includes a gate region 221 formed on the surface of the semiconductor substrate 20, and a source region 222 and a drain region 223 formed in the semiconductor substrate 20.

The pull-up transistor 23 is a PMOS transistor and may be the pull-up transistor PU1 or PU2 in FIG. 1. The pull-up transistor 23 includes a gate region 231 formed on the surface of the semiconductor substrate 20, and a drain region 232 and a source region 233 formed in the semiconductor substrate 20.

The pass gate transistor 21 and the pull-down transistor 22 are physically isolated by a first Shallow Trench Isolation (STI) region 24, and the pull-down transistor 22 and the pull-up transistor 23 are physically isolated by a second STI region 24.

The tensile stress film 25 covers the pass gate transistor 21 and the pull-down transistor 22, and the compressive stress film 26 covers the pull-up transistor 23. That is, the NOMS transistors in the 6T SRAM cell are covered with the tensile stress film 25, and the PMOS transistor in the 6T SRAM cell is covered with the compressive stress film 26. The interlayer dielectric isolation layer 27 covers the tensile stress film 25 and the compressive stress film 26.

Figure 3:
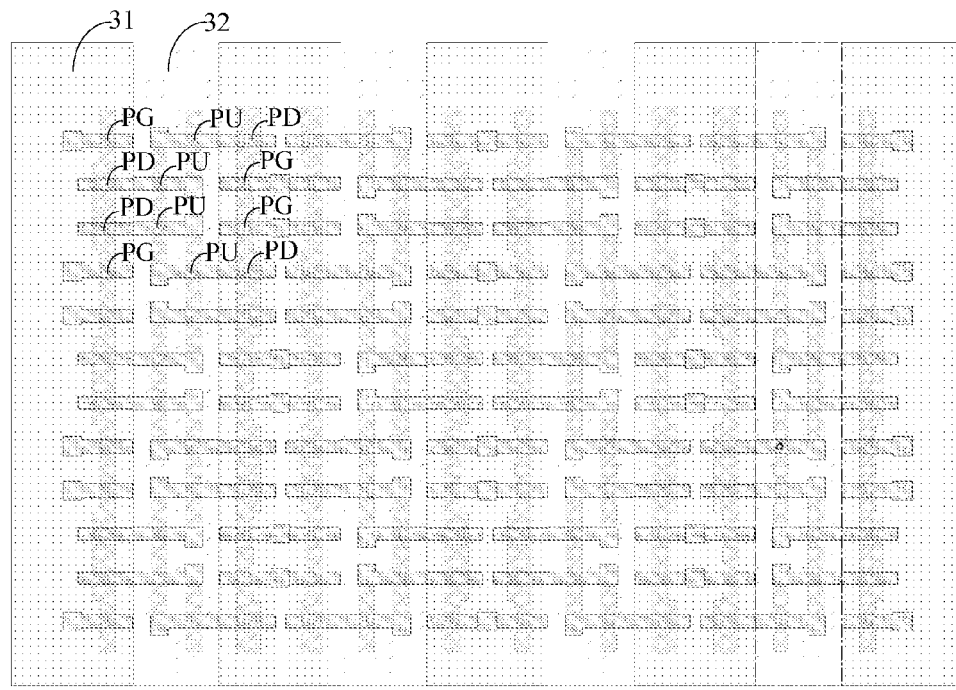
FIG. 3 illustrates a layout diagram of a SRAM array which consists of a plurality of the 6T SRAM cells shown in FIG. 2.

FIG. 3 illustrates a layout diagram of a SRAM array which consists of a plurality of the 6T SRAM cells shown in FIG. 2. Referring to FIG. 3, the SRAM array includes a plurality of pull-down transistors PD and pass gate transistors PG covered with tensile stress films 31, and a plurality of pull-up transistors PU covered with compressive stress films 32.

As described in the background, compressive stress can increase hole mobility of a PMOS transistor, and tensile stress can increase electron mobility of a NMOS transistor. In FIG. 2, the compressive stress film 26 is formed to cover the PMOS transistor and the tensile stress film 25 is formed to cover the NMOS transistors, thus, the 6T SRAM cell has better performance. However, in FIG. 1, as both carrier mobility of the pull-up transistors PU1 and PU2 and carrier mobility of the pass gate transistors PG1 and PG2 are increased, equivalent resistance of the pull-up transistors PU1 and PU2 and equivalent resistance of the pass gate transistors PG1 and PG2 are both decreased. Therefore, write margin of the 6T SRAM cell remains unchanged.

In an embodiment of the present disclosure, a SRAM cell is provided, which may have greater write margin.

In order to clarify the objects, characteristics and advantages of the disclosure, embodiments of present disclosure will be described in detail in conjunction with accompanying drawings.

Figure 4:
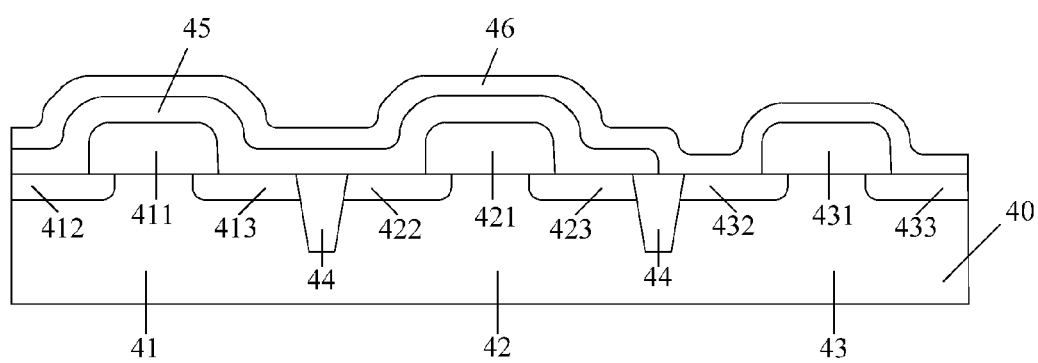
FIG. 4 illustrates a partial structural diagram of a SRAM cell according to an embodiment of the present disclosure.

FIG. 4 illustrates a partial structural diagram of a SRAM cell according to an embodiment of the present disclosure. Referring to FIG. 4, the SRAM cell includes a pull-down transistor 41, a pull-up transistor 42, a pass gate transistor 43, a tensile stress film 45 and an interlayer dielectric isolation layer 46.

The pull-down transistor 41 is a NMOS transistor and may be the pull-down transistor PD1 or PD2 in FIG. 1. The pull-down transistor 41 includes a gate region 411 formed on a surface of a semiconductor substrate 40, and a source region 412 and a drain region 413 formed in the semiconductor substrate 40.

The pull-up transistor 42 is a PMOS transistor and may be the pull-up transistor PU1 or PU2 in FIG. 1. The pull-up transistor 42 includes a gate region 421 formed on the surface of the semiconductor substrate 40, and a drain region 422 and a source region 423 formed in the semiconductor substrate 40.

The pass gate transistor 43 is a NMOS transistor and may be the pass gate transistor PG1 or PG2 in FIG. 1. The pass gate transistor 43 includes a gate region 431 formed on the surface of the semiconductor substrate 40, and a drain region 432 and a source region 433 formed in the semiconductor substrate 40.

The pull-down transistor 41 and the pull-up transistor 42 are physically isolated by a first STI region 44, and the pull-up transistor 42 and the pass gate transistor 43 are physically isolated by a second STI region 44.

The tensile stress film 45 covers the pull-down transistor 41 and the pull-up transistor 42. Specifically, the tensile stress film 45 covers the gate region 411 and at least a portion of the source region 412 and the drain region 413, and applies monoaxial tensile stress to a conductive channel between the source region 412 and the drain region 413. The tensile stress film 45 also covers the gate region 421 and at least a portion of the source region 423 and the drain region 422, and applies monoaxial tensile stress to a conductive channel between the source region 423 and the drain region 422.

In some embodiments, the tensile stress film 45 may include one or more material selected from silicon oxide, silicon nitride and silicon oxynitride. In some embodiments, a ratio of a thickness of the tensile stress film 45 to a thickness of the gate region 411 may be within a range from ⅓ to ½, or a ratio of the thickness of the tensile stress film 45 to a thickness of the gate region 421 may be within the range from ⅓ to ½. In some embodiments, the thickness of the tensile stress film 45 may be within a range from 40 nm to 250 nm.

It should be noted that, FIG. 4 only illustrates a partial structure of the SRAM cell. A whole SRAM cell should include two pull-up transistors, two pull-down transistors and two pass gate transistors. Assuming that FIG. 1 is a circuit diagram of the SRAM cell in the embodiment of the present disclosure, the pull-up transistors PU1 and PU2, and the pull-down transistor PD1 and PD2 may be covered with the tensile stress film 45, while the pass gate transistors PG1 and PG2 may not be covered with any stress films.

Still referring to FIG. 4, the interlayer dielectric isolation layer 46 covers the tensile stress film 45 and the pass gate transistor 43 to play isolation effect. In some embodiments, the interlayer dielectric isolation layer 46 may include silicon oxide or other materials which are suitable for forming an isolation layer.

It should be noted that, the interlayer dielectric isolation layer 46 covers the tensile stress film 45 and the pass gate transistor 43 directly, that is, no extra structure is formed between the interlayer dielectric isolation layer 46 and the tensile stress film 45 or between the interlayer dielectric isolation layer 46 and the pass gate transistor 43. Therefore, no stress film is formed on the pass gate transistor 43.

Figure 5:
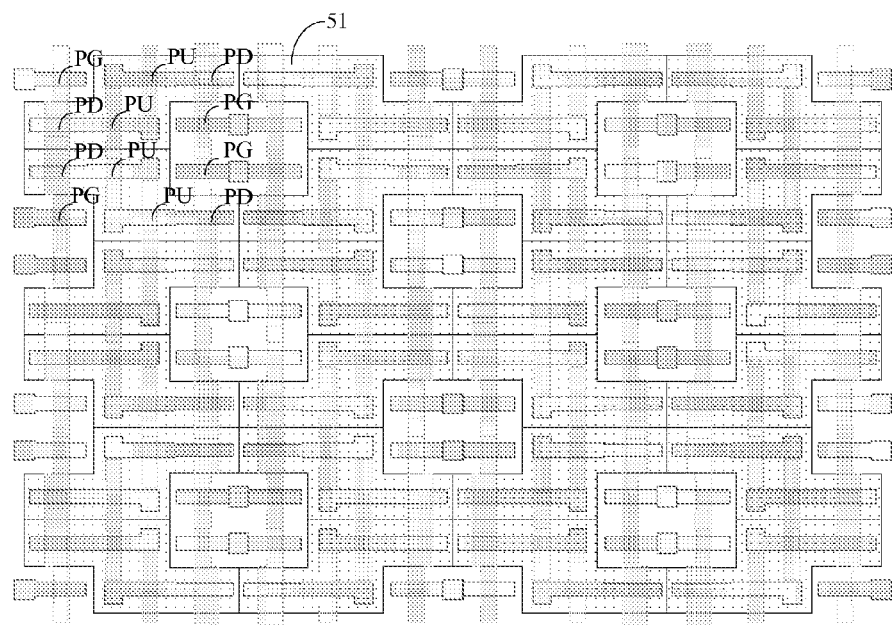
FIG. 5 illustrates a layout diagram of a SRAM array which consists of a plurality of the SRAM cells shown in FIG. 4.

FIG. 5 illustrates a layout diagram of a SRAM array which consists of a plurality of the SRAM cells shown in FIG. 4. Referring to FIG. 5, the SRAM array includes a plurality of pull-down transistors PD and pull-up transistors PU covered with tensile stress films 51, and a plurality of pass gate transistors PG not covered with any stress films.

Referring to FIG. 4, in some embodiments, the pull-up transistor 42 may be a PMOS transistor. Due to the tensile stress generated by the tensile stress film 45, carrier mobility of the PMOS transistor decreases so that equivalent resistance of the pull-up transistor 42 increases. As the pass gate transistor 43 is not covered with any stress film, carrier mobility of the pass gate transistor 43 does not change so that equivalent resistance of the pass gate transistor 43, compared to the existing techniques, remains unchanged. Therefore, write margin of the SRAM cell is increased.

In some embodiments, the pull-down transistor 41 may be a NMOS transistor. Due to the tensile stress generated by the tensile stress film 45, carrier mobility of the NMOS transistor increases, namely, carrier mobility of the pull-up transistor 41 increases. As the carrier mobility of the pass gate transistor 43 does not change, noise margin of the SRAM cell is increased.

Generally, static noise margin denotes to a maximum amplitude of direct noise signals that a SRAM cell can withstand. To a SRAM cell, static noise margin is positively correlated to a unit ratio, namely, the static noise margin increases with the unit ratio.

The unit ratio of the SRAM cell denotes to a ratio of a width-to-length ratio of the pull-down transistor 41 to a width-to-length ratio of the pass gate transistor 43. In the embodiment, due to the tensile stress film 45 which covers the pull-down transistor 41, electric performance of the pull-down transistor 41 may be enhanced and accordingly, the noise margin of the SRAM cell may be increased. When the noise margin of the SRAM cell is increased due to the enhanced electric performance of the pull-down transistor 41, it is unnecessary to enlarge the pull-down transistor 41 to further increase the noise margin, that is, a size of the pull-down transistor 41 can be decreased and further an area of the SRAM cell may be reduced.

Figure 6:
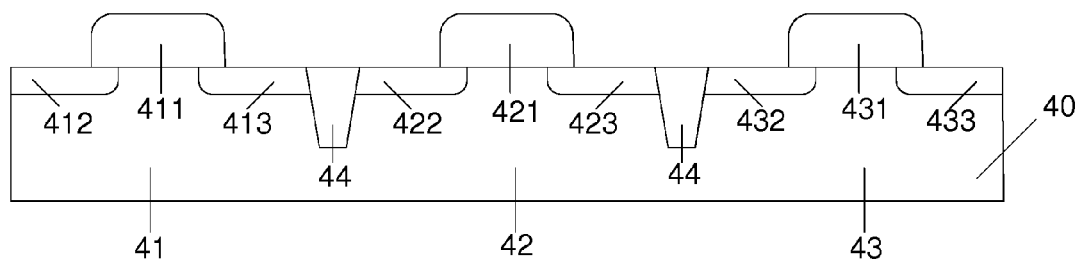
FIGS. 6 and 7 are cross-sectional views schematically illustrating intermediate structures of a process for forming a SRAM cell according to an embodiment of the present disclosure.

Accordingly, in an embodiment, a method for forming a SRAM cell is provided. Referring to FIG. 6, the pull-up transistor 42, the pull-down transistor 41 and the pass gate transistor 43 are formed on the semiconductor substrate 40.

In some embodiments, forming the pull-up transistor 42, the pull-down transistor 41 and the pass gate transistor 43 on the semiconductor substrate 40 may include: forming the source region 423 and the drain region 422 of the pull-up transistor 42, the source region 412 and the drain region 413 of the pull-down transistor 41, and the source region 432 and the drain region 433 of the pass gate transistor 43 in the semiconductor substrate 40; and forming the gate region 421 of the pull-up transistor 42, the gate region 411 of the pull-down transistor 41 and the gate region 431 of the pass gate transistor 43 on a surface of the semiconductor substrate 40. The pull-down transistor 41 and the pull-up transistor 42 are physically isolated by the first STI region 44, and the pull-up transistor 42 and the pass gate transistor 43 are physically isolated by the second STI region 44.

Detail processes for forming the pull-up transistor 42, the pull-down transistor 41 and the pass gate transistor 43 on the semiconductor substrate 40 are known to those skilled in the art, and are not described in detail here.

Figure 7:
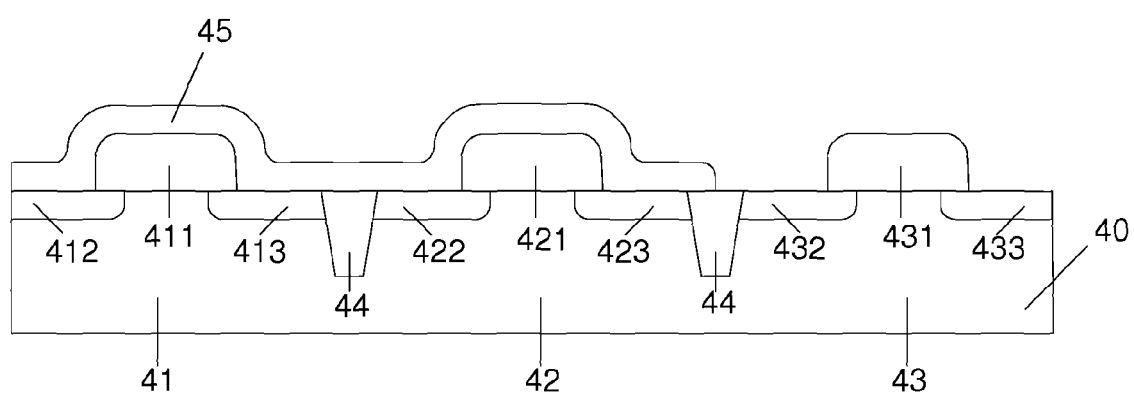

Referring to FIG. 7, the tensile stress film 45 is formed on the pull-up transistor 42 and the pull-down transistor 41. In some embodiments, the tensile stress film 45 may be formed by a vapor deposition process, such as a physical vapor deposition process or a chemical vapor deposition process.

In some embodiments, forming the tensile stress film 45 on the pull-up transistor 42 and the pull-down transistor 41 may include: forming the tensile stress film 45 on the gate region 421, on at least a portion of the source regions 423 and drain regions 422, on the gate region 411, and on at least a portion of the source regions 412 and drain regions 413.

In some embodiments, the tensile stress film 45 may be formed by following steps. First, a tensile stress film material layer is formed on the pull-up transistor 42, the pull-down transistor 41 and the pass gate transistor 43. Then, a mask layer is formed on a first portion of the tensile stress film material layer which portion covers the pull-up transistor 42 and the pull-down transistor 41. Afterwards, a second portion of the tensile stress film material layer which portion covers the pass gate transistor 43 is etched with the mask layer as a mask, to expose the pass gate transistor 43. Last, the mask layer is removed to form a structure shown in FIG. 7. The remained tensile stress film material layer is the tensile stress film 45.

In some embodiments, after the tensile stress film 45 is formed, the interlayer dielectric isolation layer is formed on the tensile stress film 45 and the pass gate transistor 43, to form the SRAM cell shown in FIG. 4. In some embodiments, the interlayer dielectric isolation layer may be formed by a deposition process. In some embodiments, the interlayer dielectric isolation layer may include silicon oxide.

From above, in SRAM cells and forming methods thereof provided in embodiments of the present disclosure, write margin of the SRAM cells may be increased and areas of the SRAM cells may be decreased.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure. Therefore, the protection scope of the present disclosure is subject to the scope defined by the claims.

What is claimed is:

1. A static random access memory (SRAM) cell, comprising:
a pull-up transistor, a pull-down transistor, a pass gate transistor, a tensile stress film which covers the pull-up transistor and the pull-down transistor, and an interlayer dielectric isolating layer which covers the tensile stress film and the pass gate transistor;
wherein the tensile stress film does not cover the pass gate transistor; and wherein the interlayer dielectric isolating layer is in contact with the pass gate transistor.

2. The SRAM cell according to claim 1, wherein the pull-up transistor comprises a first gate region, a first source region and a first drain region, the pull-down transistor comprises a second gate region, a second source region and a second drain region, and the tensile stress film covers the first gate region, at least a portion of the first source and drain regions, the second gate region, and at least a portion of the second source and drain regions.

3. The SRAM cell according to claim 1, wherein the tensile stress film comprises one or more material selected from silicon oxide, silicon nitride and silicon oxynitride.

4. The SRAM cell according to claim 1, wherein a ratio of a thickness of the tensile stress film to a thickness of the second gate region is within a range from ⅓ to ½.

5. The SRAM cell according to claim 1, wherein a ratio of a thickness of the tensile stress film to a thickness of the first gate region is within a range from ⅓ to ½.

6. The SRAM cell according to claim 1, wherein a thickness of the tensile stress film is within a range from 40 nm to 250 nm.

7. The SRAM cell according to claim 1, wherein the SRAM cell comprises two pull-up transistors, two pull-down transistors and two pass gate transistors.

8. A method for forming a SRAM cell, comprising:
providing a semiconductor substrate;
forming a pull-up transistor, a pull-down transistor and a pass gate transistor on the semiconductor substrate;
forming a tensile stress film covering the pull-up and pull-down transistors;
forming an interlayer dielectric isolating layer covering the tensile stress film and the pass gate transistor;
wherein the tensile stress film does not cover the pass gate transistor; and wherein the interlayer dielectric isolating layer is in contact with the pass gate transistor.

9. The method according to claim 8, wherein forming the pull-up transistor, the pull-down transistor and the pass gate transistor on the semiconductor substrate comprises: forming first source and drain regions, second source and drain regions, and third source and drain regions in the semiconductor substrate; and forming a first gate region, a second gate region and a third gate region on a surface of the semiconductor substrate, where the first source, drain and gate regions constitute the pull-up transistor, the second source, drain and gate regions constitute the pull-down transistor, and the third source, drain and gate regions constitute the pass gate transistor, and
forming the tensile stress film covering the pull-up and pull-down transistors comprises: forming the tensile stress film on the first gate region, on at least a portion of the first source and drain regions, on the second gate region, and on at least a portion of the second source and drain regions.

10. The method according to claim 8, wherein the tensile stress film is formed by a vapor deposition process.

* * * * *